United States Patent [19]
Fukuyama et al.

[11] Patent Number: 5,350,920
[45] Date of Patent: Sep. 27, 1994

[54] ION BEAM ANALYZING APPARATUS

[75] Inventors: Hirofumi Fukuyama; Tatuya Noguchi; Kenichi Inoue; Kiyotaka Ishibashi; Shigeto Adachi, all of Kobe, Japan

[73] Assignee: Kabushiki Kaisha Kobe Seiko Sho, Kobe, Japan

[21] Appl. No.: 994,953

[22] Filed: Dec. 22, 1992

[30] Foreign Application Priority Data

Dec. 25, 1991 [JP] Japan .................................. 3-343358
Nov. 19, 1992 [JP] Japan .................................. 4-310360

[51] Int. Cl.$^5$ .............................................. H01J 37/28
[52] U.S. Cl. .............................. 250/309; 250/492.21
[58] Field of Search .................... 250/309, 398, 492.21, 250/505.1

[56] References Cited

U.S. PATENT DOCUMENTS

| | | | |
|---|---|---|---|
| 4,055,770 | 10/1977 | Milcamps et al. | 250/505.11 |
| 4,207,489 | 6/1980 | Camplan | 250/505.1 |
| 4,761,559 | 8/1988 | Myron . | |
| 5,025,167 | 6/1991 | Okuda et al. | 250/492.21 |
| 5,063,294 | 11/1991 | Kawata et al. | 250/492.21 |
| 5,065,034 | 11/1991 | Kawanami et al. | 250/505.1 |

FOREIGN PATENT DOCUMENTS 0398335 11/1990 European Pat. Off. .

*Primary Examiner*—Bruce C. Anderson
*Attorney, Agent, or Firm*—Oblon, Spivak, McClelland, Maier & Neustadt

[57] ABSTRACT

An ion beam analyzing apparatus wherein a scan image displayed on display means and the profile of an ion beam can be made coincide with each other readily to assure a high operability. Slit members for X and Y directions of an objector collimator are provided for movement to vary the dimensions of slits defined thereby, and dimensions A and B of the slits in the X and Y directions are detected. Dimensions X' and Y' of a spot of an ion beam irradiated upon a specimen on a target are calculated by multiplying the dimensions A and B by reduction ratios fx and fy of quadruple pole magnetic lenses, respectively, and then the dimensions X' and Y' are multiplied by values obtained by division of conditions Cx and Cy of an image apparatus by current scanning widths Sx and Sy of deflecting electrodes to calculate enlarged beam spot diameters X" and Y" respectively. An image having the diameters X" and Y" is displayed on a cathode ray tube so that an operator can visually grasp it. Consequently, a scan image of the specimen and the profile of the ion beam can be made coincide readily with each other by manual operation of a manually operable mechanism of a beam position setter.

7 Claims, 6 Drawing Sheets

ION BEAM ANALYZING APPARATUS

BACKGROUND OF THE INVENTION

1. FIELD OF THE INVENTION

This invention relates to improvements in operability of an ion beam analyzing apparatus which analyzes composition and/or physical properties of a small area of an element, a product or the like using a high energy charge beam in various industrial fields including the technical field of semiconductors, the medical and biological technical fields and so forth, and more particularly to an ion beam analyzing apparatus wherein a scan image displayed on a display device and the shape of a beam spot of an ion beam can be made to coincide readily with each other.

2. DESCRIPTION OF THE PRIOR ART

As is well known in the technical field of semiconductors, an increase of the storage capacity and an increase of the information processing speed are demanded in order to process a large amount of information on a computer. To this end, development of high integration of ICs has been directed from LSIs to VLSIs and further to three dimensional ICs. As such development proceeds, individual elements, wires for those elements are remarkably reduced in size and increased in number of layers and besides use of a very shallow region under a surface is proceeding. Meanwhile, in development or process investigation of such ICs, an analysis of a distribution of atoms in a microscopic area is very important, and recently, the effectiveness of analyzing techniques such as the Rutherford backscattering method (RBS) and the particle excitation X-ray spectroscopic method (PIXE) which employ a converged ion beam of a high energy (MeV) have a resolution smaller than 1 $\mu$m is recognized. Thus, improvement in function of an ion beam analyzing apparatus is being proceeded.

FIG. 6 schematically shows an exemplary one of a conventional ion beam analyzing apparatus. Referring to FIG. 6, the conventional ion beam analyzing apparatus is generally denoted at 51 and includes an ion source 53 disposed in an ion accelerator 52. A high energy ion beam 55 is generated from the ion source 53 of the ion accelerator 52 and accelerated by an accelerator tube 54 in the ion accelerator 52 has. The thus accelerated high energy ion beam 55 is then deflected, while passing through a deflecting analyzing electromagnet 56, normally by the angle of 15 degrees so that it is classified in ion type and energy. Subsequently, the high energy ion beam 55 is restricted to several tens $\mu$m in diameter by an objective collimator 57 and then, after passing a drift space of several meters and deflecting electrodes 62, is introduced into two or three series of quadruple pole magnetic lenses 58. While the high energy ion beam 55 passes the quadruple pole magnetic lenses 58, it is converged at predetermined reduction ratios (constants) in the X and Y directions, which depend upon the quadruple pole magnetic lenses 58 and an optical layout dimension, and then it is irradiated upon a target 60 accommodated in a vacuum chamber 59, that is, upon a specimen on the target 60, so that it forms a beam spot on the specimen. Consequently, ions, electrons, photons and so forth are scattered and radiated from the specimen by a mutual action of the incident ion beam 55 and the target 60. Those particles are detected by means of a detector 61 and a secondary electron detector 63 provided in the vacuum chamber 59. A detection value detected by the secondary electron detector 63 is inputted to and displayed on an image apparatus (not shown).

In the ion beam analyzing apparatus 51, an ion beam 55 is deflected by the deflecting electrodes 62 interposed between the objective collimator 57 and the two series of quadruple pole magnetic lenses 58 so that it can be irradiated upon an arbitrary position of the specimen on the target 60 to form a beam spot in units of microns. Further, since the position of the beam spot is moved by applying a high frequency potential to the deflecting electrodes 62 or supplying a high frequency voltage to the deflecting electrodes 62 by way of manual operation of a manually operable mechanism (not shown), a certain preset area of the specimen on the target 60 can be scanned by the beam spot. Further, a two-dimensional surface analysis in the area can be performed by displaying a signal for analysis on a cathode ray tube in synchronism with the scanning position of the ion beam. It is to be noted that the deflecting electrodes 62 can be replaced with deflecting magnetic poles.

Meanwhile, since an ion beam is irradiated upon the target 60, secondary electrons are generated from the surface of the specimen supported on the target 60. However, since the intensity of the secondary electrons thus generated differs depending upon the profile of the surface of the specimen or the kinds of elements of the specimen if the beam irradiating conditions are identical, information conforming to the differences can be obtained.

Accordingly, a surface image equivalent to that obtained by a scanning microscope can be obtained by synchronizing the signal of the secondary electrons with the position of the beam spot, which depends upon a high frequency potential or a high frequency current, by way of scintillation and by means of a photomultiplier. Making use of this fact, upon analysis, the irradiation position of an ion beam is set in accordance with a surface scan image obtained from secondary electrons and the set position data are inputted to the deflecting electrodes at the position to effect setting of the position of the ion beam. Such an operation is normally performed by visually displaying and setting, while a surface image of the specimen obtained from secondary electrons is displayed on a cathode ray tube, the position information as a point on the cathode ray tube in accordance with the set image condition. Then, after such inputting, an ion beam is automatically positioned and irradiated at the position to collect data in order to make an analysis.

While the deflecting electrodes 62 in the conventional ion beam analyzing apparatus described above is interposed between the objective collimator 57 and the quadruple pole magnetic lenses 58, they are sometimes disposed at some other positions. Referring to FIG. 7, there is shown another exemplary one of conventional ion beam analyzing apparatus. In the second conventional ion beam analyzing apparatus, the deflecting electrodes 62 are disposed between the quadruple pole magnetic lenses 58 and the vacuum chamber 59 so that an ion beam converged by the quadruple pole magnetic lenses 58 is deflected by the deflecting electrodes 62 and introduced to the target 60 in the vacuum chamber 59.

U.S. Pat. No. 5,063,294 discloses a converged ion beam apparatus which makes a prior art document to the invention of the present application. An objective slit device of the electrostatic capacitance type for detecting a width of a variable aperture is disclosed in Japanese Patent Laid-Open Application No. Heisei 2-281546. A build-up type high precision quadruple pole magnetic lens is disclosed in Japanese Patent Laid-Open Application No. Heisei 2-244547. A correcting method for an error of the direction of rotation of a beam by a quadruple pole magnetic lens is disclosed in Japanese Patent Laid-Open Application No. Heisei 2-256147. A monitoring method for an RBS analysis and/or a PIXE analysis using a secondary electron image is disclosed in Japanese Patent Laid-Open Application No. Heisei 3-238743. A vacuum vessel in which a plurality of specimens can be accommodated is disclosed in Japanese Patent Laid-Open Application No. Heisei 3-261058. An apparatus wherein a plurality of semiconductor detectors are employed and detection signals of them are added in order to decrease the measuring time is disclosed in Japanese Patent Laid-Open Application No. Heisei 3-81938.

SUMMARY OF THE INVENTION

It is an object of the present invention to provide an ion beam analyzing apparatus wherein a scan image reflected on display means and the profile of an ion beam can be made to coincide with each other readily to assure a high operability.

In order to attain the object, according to the present invention, there is provided an ion beam analyzing apparatus for irradiating an ion beam upon a specimen to analyze a small area of the specimen, which comprises an ion accelerator for accelerating ions generated from an ion source to form an ion beam, a vacuum chamber for accommodating therein a specimen to be analyzed, the vacuum chamber including a secondary electron detector, an objective collimator interposed between the ion accelerator and the vacuum chamber for varying the size of a slit of a slit device to restrict the ion beam, a magnetic lens interposed between the ion accelerator and the vacuum chamber for converging and irradiating the ion beam upon the specimen in the vacuum chamber to form a beam spot on the specimen, display means for displaying thereon the position of the beam spot and a detection signal detected by the secondary electron detector as a secondary electron image, and calculating means for calculating the dimensions of the beam spot in accordance with the size data of the slit of the slit device and displaying an image in accordance with the thus calculated dimensions.

In the ion beam analyzing apparatus, an ion beam is restricted by the slit of the slit device of the objective collimator which is increased or decreased in size by the objective collimator, and the size of the slit of the slit device is found out. Then, the dimensions of a spot of an ion beam converged by the magnetic lens and irradiated upon a specimen in the vacuum chamber are calculated in accordance with the size data of the slit of the slit device by the calculating means which depends upon an optical layout dimension. A result of the calculation of the dimensions is displayed as an image of the spot of the ion beam on the display means.

Consequently, with the ion beam analyzing apparatus, an ion beam spot can be visually grasped by way of the display means, and as a result, the scan image and the profile of the ion beam spot can be made to coincide readily which each other. Accordingly, a high operability is assured with the ion beam analyzing apparatus, and the efficiency in analyzing operation of a specimen is enhanced remarkably.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 1b is a diagrammatic view showing the screen of a cathode ray tube of the ion beam analyzing apparatus of FIG. 1a;

FIG. 2 is a perspective view showing part of the ion beam analyzing apparatus indicated at A in FIG. 1a;

FIG. 5b is a diagrammatic view showing the screen of a cathode ray tube of the ion beam analyzing apparatus of FIG. 5a;

DESCRIPTION OF THE PREFERRED EMBODIMENTS

Figure 1A:
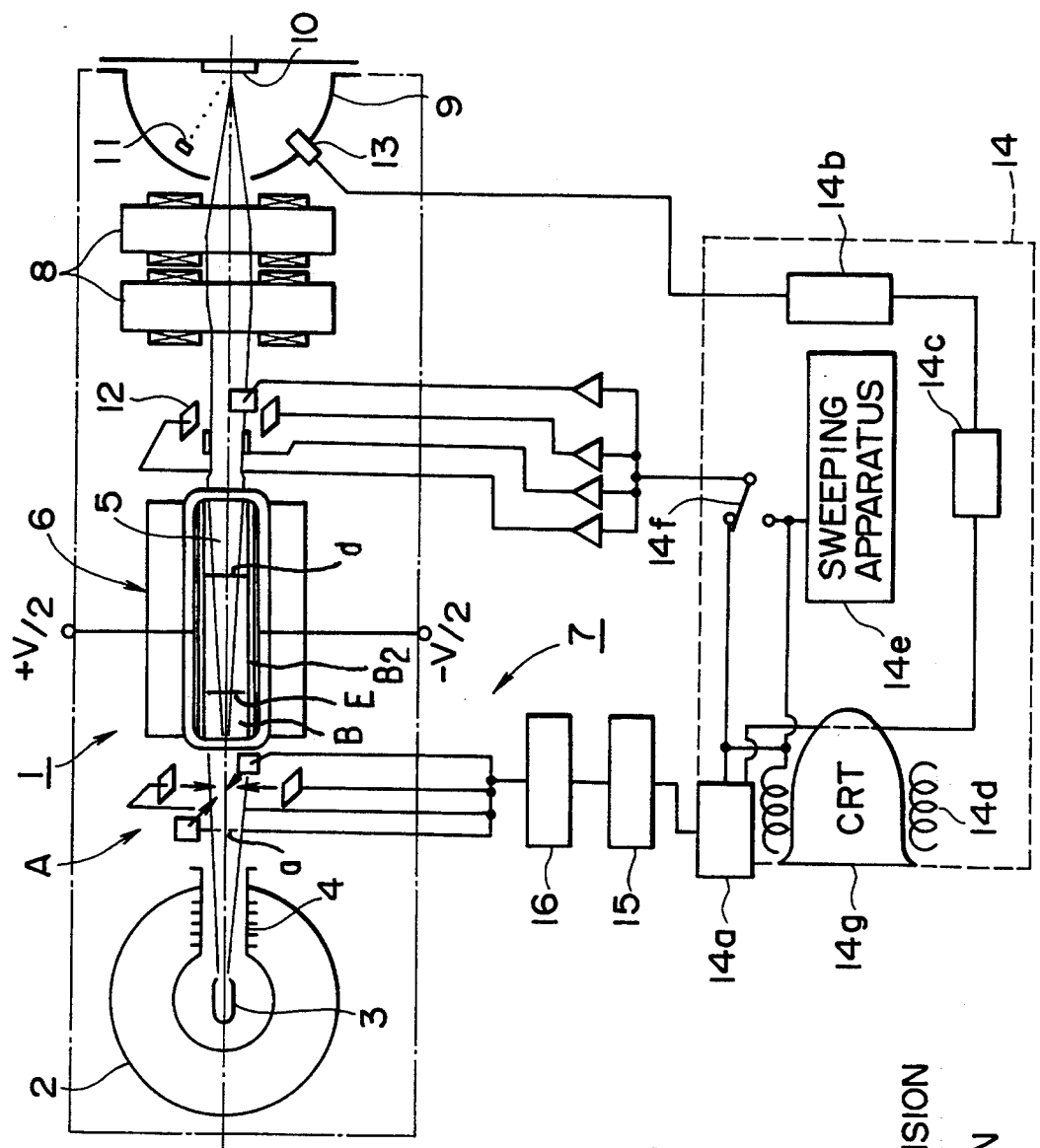
FIG. 1a is a diagrammatic view schematically showing an entire ion beam analyzing apparatus according to a first preferred embodiment of the present invention.

Referring first to FIG. 1a, there is shown an ion beam analyzing apparatus according to a first preferred embodiment of the present invention. The ion beam analyzing apparatus shown is generally denoted at 1 and includes an ion source 3 disposed in an ion accelerator 2. A high energy ion beam 5 is generated from the ion source 3 of the ion accelerator 2 and accelerated by an accelerator tube 4 in the ion accelerator 2. The thus accelerated high energy ion beam 5 is then restricted to several tens $\mu m$ in diameter by an objective collimator 7 and then introduced into a mass separator 6 of the EXB type having a well known construction. While the ion beam 5 passes the mass separator 6, it is classified in ion type and energy. Then, the ion beam 5 is reflected by deflecting electrodes 12 and is then introduced into two or three series of quadruple pole magnetic lenses 8. While the ion beam 5 passes the quadruple pole magnetic lenses 8, it is converged at predetermined reduction ratios (constants) in the X and Y directions which depend upon the quadruple pole magnetic lenses 8, and is irradiated upon a target 10 accommodated in a vacuum chamber 9, that is, upon a specimen on the target 10, so that it forms a beam spot on the specimen.

Consequently, ions, electrons, photons and so forth are scattered and radiated from the specimen by a mutual action of the incident ion beam 5 and the target 10. Those particles are detected by means of a detector 11 and a secondary electron detector 13 provided in the vacuum chamber 9, and a detection value detected by the secondary electron detector 13 is inputted to an image apparatus 14 having such a construction as described below. In particular, the image apparatus 14 includes a beam position setter 14a, and an arithmetic unit 15 and an object collimator controller 16, which will individually be hereinafter described, both interposed between the beam position setter 14a and motors 7m. The motors 7m are provided for increasing or decreasing the dimensions of slits in the X and Y directions of the object collimator 7, which has such a construction as hereinafter described, each between a minimum slit dimension 0 and a predetermined dimension.

Figure 2:
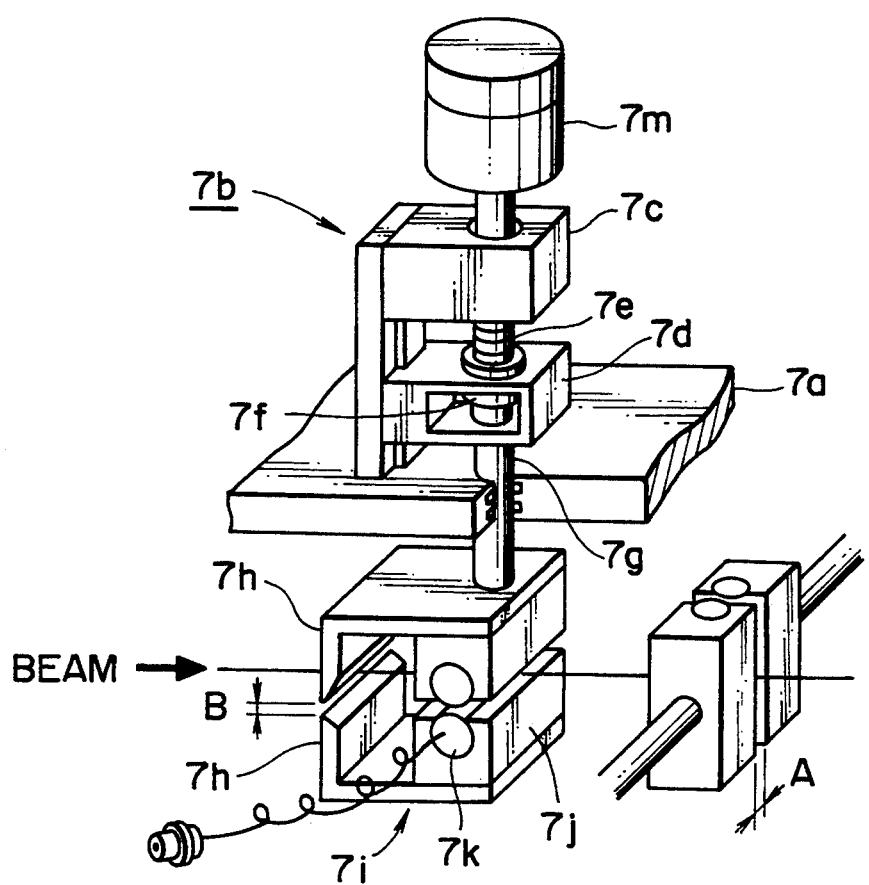

The mechanisms for moving the objective collimator 7 in the X and Y directions have similar constructions to each other as can be seen well from FIG. 2, and therefore, the mechanism for moving the objective collimator 7 will be described as an example. Referring to FIG. 2, the objective collimator 7 includes a base plate 7a, and a slit member supporting table 7b provided on the base plate 7a and having an upper receiving table 7c and a lower receiving table 7d disposed horizontally in a vertically spaced relationship on a same side face thereof. The base plate 7a and the upper and lower receiving tables 7c and 7d have through-holes formed in a coaxial relationship therein. A motor 7m in the form of a reversible motor is mounted on the receiving table 7c, and an output power shaft of the motor 7m extends through the through-hole in the upper receiving table 7c. A ball screw 7e is connected to an end of the output shaft of the motor 7m, and an end portion of the ball screw 7e is connected to an upper end of a slit operating rod 7g by way of a connecting element 7f. The connecting element 7f is fitted in the through-hole of the lower receiving table 7d and is slidably moved in the through-hole by the ball screw 7e which is rotated by rotation of the motor 7m. The slit operating rod 7g extends through the lower receiving table 7d and has an L-shaped slit member 7h securely mounted at a lower end thereof. Consequently, the slit operating rod 7g is slidably moved by sliding movement of the connecting element 7f caused by rotation of the ball screw 7e, whereupon the slit member 7h is moved back and forth in predetermined directions to increase or decrease the dimension of the slit of the objective collimator 7.

Another slit member 7h for the Y direction is provided in an opposing relationship below the slit member 7h, and a slit is formed between ends of vertical portions of the slit members 7h. The slit members 7h are synchronously moved toward and away from each other to vary the dimension of the slit between 0 and the predetermined value. Meanwhile, as described hereinabove, the slit members 7h for the X direction have the same construction as the slit members 7h for the Y direction described just above except that they are moved in the horizontal directions to vary the dimensions of a slit formed between them while the slit members 7h for the Y direction are moved in the vertical directions.

A block 7j is securely mounted on a face of each of the slit members 7h remote from the slit operating rod 7g for the slit member 7h and extends perpendicularly to the advancing direction of the ion beam 5. A molybdenum rod 7k having the diameter of 10mm and the length of 10 mm is embedded in each of the blocks 7j. The molybdenum rods 7k are disposed in a spaced relationship by a distance equal to the distance between the slit members 7h and serves as a slit dimension detecting section 7i.

Accordingly, the distance between the slit members 7h, in short, the slit dimension, is detected from the distance between the molybdenum rods 7k. Meanwhile, the objective collimator controller 16 interposed between the beam position setter 14a and the motors 7m detects the slit dimension A in the X direction and the slit dimension B in the Y direction formed between the slit members 7h as they are driven to move by the motors 7m, and outputs the thus detected dimensions A and B to the arithmetic unit 15.

Figure 1B:
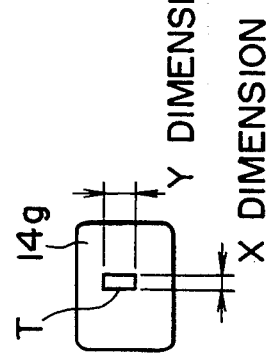
Figure 3:
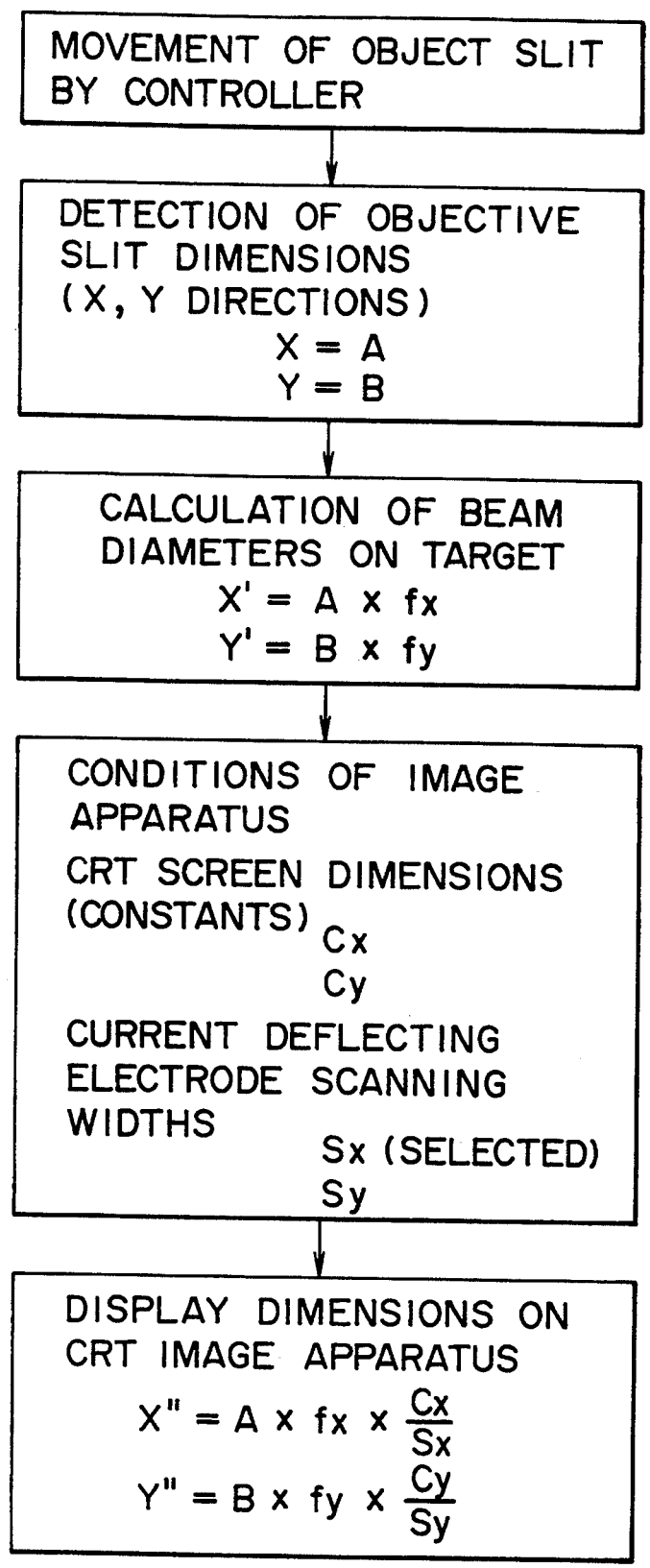
FIG. 3 is a flow chart illustrating successive steps of operation of the ion beam analyzing apparatus of FIG. 1a from opening or closing movement of a slit member of an objective collimator to inputting to an image apparatus.

The arithmetic unit 15 calculates actual dimensions X' and Y' of a beam spot formed on the target 10 from a reduction ratio fx in the X direction and another reduction ratio fy in the Y direction of the ion beam 5 by the quadruple pole magnetic lenses 8. The arithmetic unit 15 enlarges the thus calculated values X' and Y' at a predetermined rate and outputs resulted values of the enlargement to the beam position setter 14a and also to a cathode ray tube (CRT) 14g so that the output values may be displayed on the cathode ray tube 14g. By the way, while the actual dimensions X' and Y' of beam spots formed on the specimen on the target 10 are represented by $X'=A \times fx$ and $Y'=B \times fy$, respectively, they actually are very small dimensions. Therefore, as illustrated in FIG. 3, the value X' is multiplied by a value obtained by division of the condition Cx of the image apparatus 14 by the current scanning width Sx by the deflecting electrodes 12 while the value Y' is multiplied by a value obtained by division of the condition Cy of the image apparatus 14 by the current scanning width Sy by the deflecting electrodes 12 to calculate $X''=A \times fx(Cx/Sx)$ and $Y''=B \times fy(Cy/Sy)$, respectively, and an image having the thus enlarged dimensions X'' and Y'' is displayed as a beam spot mark T on the cathode ray tube 14g of the image apparatus 14 as shown in FIG. 1b.

Subsequently, the procedure to inputting from the objective collimator 7 to the cathode ray tube 14g of the image apparatus 14 will be described with reference to FIG. 3.

At the first step, the objective collimator controller 16 will be manually operated to activate the motors 7m so that the slit members 7h for the X and Y directions of the objective collimator 7 are moved by way of the ball screws 7e, connecting elements 7f, and slit operating rods 7g.

At the second step, the slit dimension A in the X direction and the slit dimension B in the Y direction of the slit members 7h from the slit distance 0 (closed slit condition) are detected by the slit dimension detecting sections 7i provided for the slit members 7h for the X and Y directions, respectively.

At the third step, the slit distance A and the slit distance B thus detected are multiplied by the reduction radio fx for the X direction and the reduction ratio fy for the Y direction of the quadruple pole magnetic lenses 8, respectively, to calculate actual diameters of a spot of the ion beam 5 formed on the surface of the specimen on the target 10, that is, $X'=A \times fx$ and $Y'=B \times fy$, by means of the arithmetic unit 15.

At the fourth step, conditions of the image apparatus 14, that is, dimensions (constants) Cx and Cy of the screen of the cathode ray tube 14g, are selected and the current scanning widths Sx and Sy of the deflecting electrodes 12 in the X and Y directions are selected by the arithmetic unit 15.

At the fifth step, enlarged dimensions of the slit dimensions A and B enlarged at a predetermined ratio and given by $X''=A \times fx \times (Cx/Sx)$ and $Y''=B \times fy \times (Cy/Sy)$, respectively, are calculated by the arithmetic unit 15, and an image of the enlarged dimensions are displayed as a graspable beam spot mark T on the cathode ray tube 14g of the image apparatus 14 as shown in FIG. 1b.

In particular, the motors 7m are driven by the objective collimator controller 16, and the slit dimensions A and B from the respective slit distances 0 (closed conditions) are calculated by the slit distance detecting sections 7i. Then, the slit dimensions A and B are multiplied by the reduction ratios of the quadruple pole magnetic lenses 8 which depend upon an optical layout dimension by the arithmetic unit 15 and are inputted as dimensions of converged beams on the target 10 to the beam position setter 14. A sweeping apparatus 14e for performing scanning of a beam for observation of a secondary electron image of the specimen provided on the target 10 displays on the cathode ray tube 14g as a secondary electron image an enlarged image of the surface of the specimen which is multiplied by a multiplication factor which depends upon the scanning width and the dimension of an image to be displayed on the cathode ray tube 14g. Further, in addition to the set beam position, a beam spot mark T having a rectangular profile wherein the dimensions in the X and Y directions of the ion beam 5 converged on the target 10 are represented as $X''\times Y''$ is disposed on the secondary electron image of the cathode ray tube 14g as shown in FIG. 1b.

Subsequently, an operator will manually operate the manually operable mechanism of the beam position setter 14a to move the beam spot mark T having the set slit dimensions and the ion beam position information upwardly or downwardly and leftwardly or rightwardly on the screen of the cathode ray tube 14g so as to adjust the beam spot mark T to a position at which the operator wants to measure a secondary electron image. Thus, for example, when the profile of a portion of the specimen on the micron order to be measured does not conform to the profile and the dimensions of the ion beam, then the objective collimator 7 is operated by the objective collimator controller 16 to vary the slit dimensions A and B, and thereupon, the X and Y dimensions of the beam spot mark T displayed on the screen of the cathode ray tube 14g are automatically varied. Therefore, the beam spot mark T can be readily positioned at the profile of the specimen. Further, when the profile of the beam spot is adjusted in this manner, it can be adjusted to the maximum area of the portion of the specimen to be measured, and the amount of irradiation of the ion beam is increased as a whole. As a result, the advantage is provided that the time for analysis of a specimen is decreased and the efficiency of the analyzing operation is improved.

Figure 4:
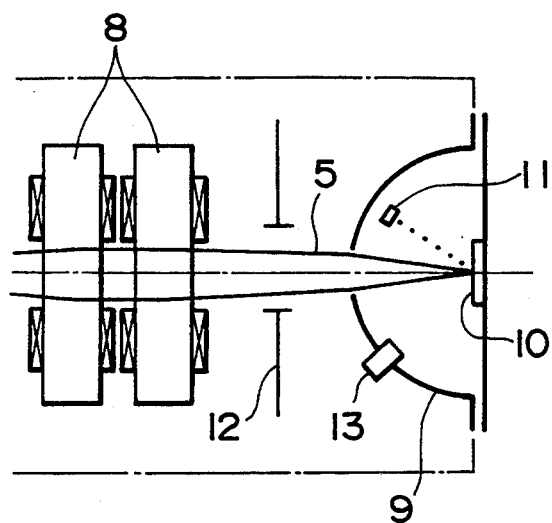
FIG. 4 is a schematic view showing a principal portion of an ion beam analyzing apparatus according to a second preferred embodiment of the present invention.

An ion beam analyzing apparatus according to a second preferred embodiment of the present invention will be described subsequently with reference to FIG. 4 in which only part of the ion beam analyzing apparatus is shown. The ion beam analyzing apparatus of the present embodiment is a modification to and principally different from the ion beam analyzing apparatus of the first embodiment described above in that the deflecting electrodes 12 are disposed at different locations as can be seen from FIGS. 1a and 4. More particularly, the deflecting electrodes 12 are interposed between the quadruple pole magnetic lenses 8 and the vacuum chamber 9 similarly as in the conventional ion beam analyzing apparatus described hereinabove with reference to FIG. 7. Since the ion beam analyzing apparatus of the present embodiment has the same construction as the ion beam analyzing apparatus of the first embodiment except the locations of the deflecting electrodes 12, it exhibits similar advantages to those of the ion beam analyzing apparatus of the first embodiment.

Figure 5A:
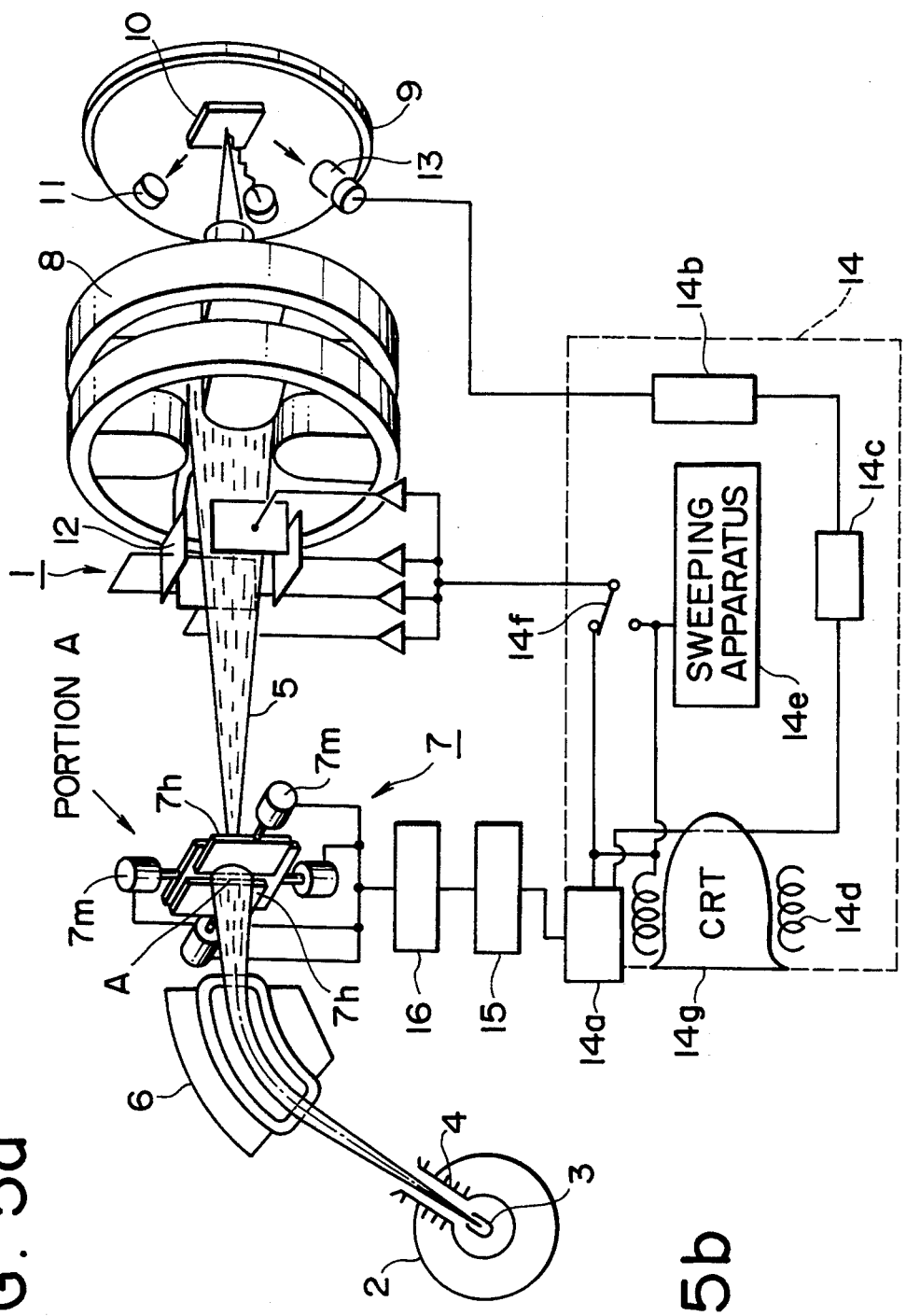
FIG. 5a is a diagrammatic view schematically showing an entire ion beam analyzing apparatus according to a third preferred embodiment of the present invention.
Figure 5B:
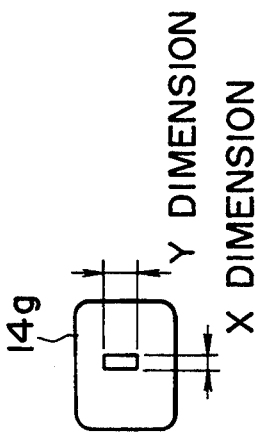
Figure 6:
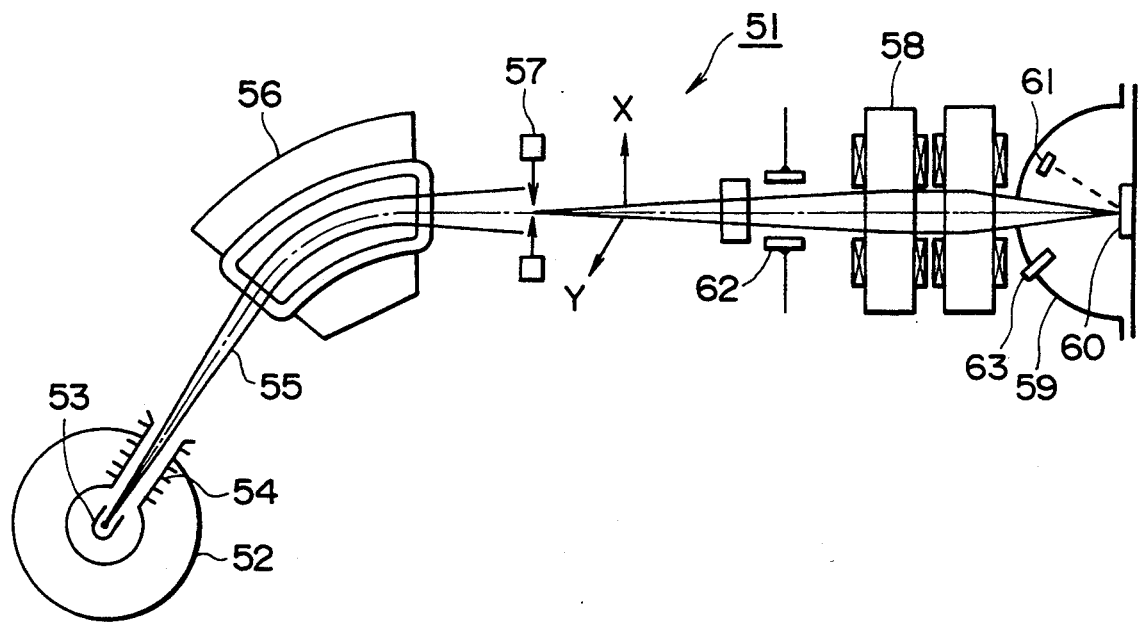
FIG. 6 is a schematic view of an exemplary one of conventional ion beam analyzing apparatus.

An ion beam analyzing apparatus according to a third preferred embodiment of the present invention will be described subsequently with reference to FIGS. 5a and 5b. Also the ion beam analyzing apparatus of the present embodiment is a modification to the ion beam analyzing apparatus of the first embodiment but is different only in that it includes, in place of the mass separator 6 of the EXB type for separating an ion beam 5 in ion type and energy, a deflecting analyzing electromagnet 6 which is interposed between the ion accelerator 2 and the objective collimator 7.

Accordingly, a high energy ion beam 5 generated from the ion source 3 of the ion accelerator 2 and accelerated by the accelerator tube 4 of the ion accelerator 2 is deflected, while passing through the deflecting analyzing electromagnet 6, normally by an angle of 15 degrees so that it is classified in ion type and energy. Subsequently, the high energy ion beam 5 is restricted into a micro-beam by the objective collimator 7 and then passes a drift space of several meters and the deflecting electrodes 12. Then, when the high energy ion beam 5 passes the succeeding quadruple pole magnetic lenses 8, it is converged at predetermined reduction ratios in the X and Y directions, which depend upon the quadruple pole magnetic lenses 8, and is then irradiated upon the target 10 accommodated in the vacuum chamber 9 so that it forms a spot on the target 10.

Then, enlarged dimensions of the slit dimensions A and B which are enlarged at predetermined ratios and given by $X''=A\times fx\times(Cx/Sx)$ and $Y''=B\times fy\times(-Cy/Sy)$ are calculated by the arithmetic unit 15 by way of the first to fifth steps described hereinabove with reference to FIG. 3. An image of the enlarge dimensions is displayed as a graspable beam spot mark T on the cathode ray tube 14g of the image apparatus 14. Accordingly, the ion beam analyzing apparatus of the present embodiment exhibits similar advantages to those of the ion beam analyzing apparatus of the first embodiment described hereinabove.

Figure 7:
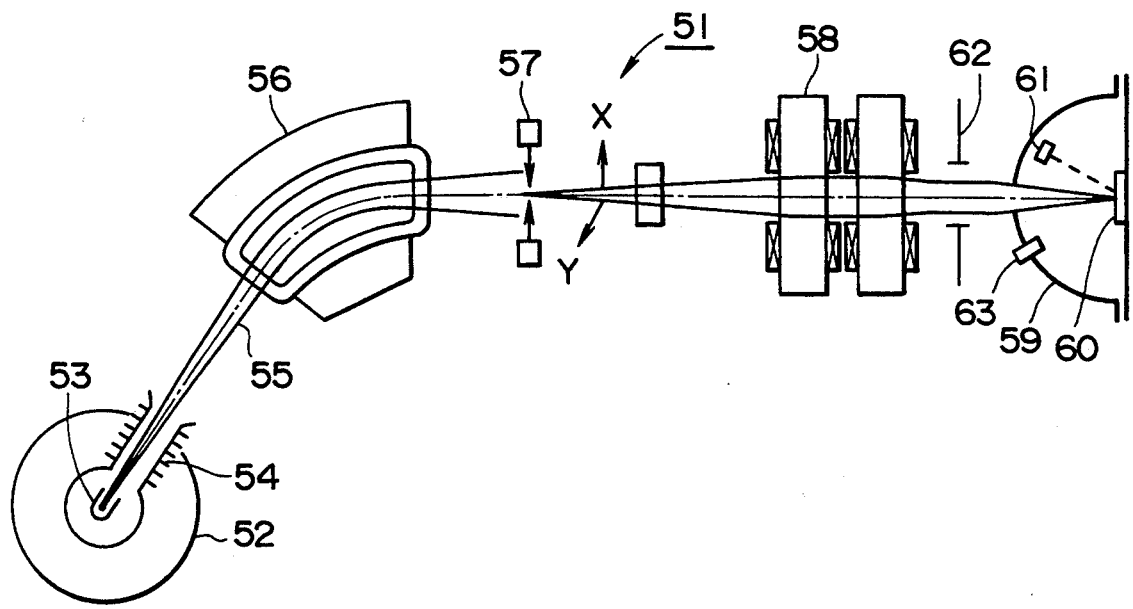
FIG. 7 is a schematic view of another exemplary one of conventional ion beam analyzing apparatus.

It is to be noted that, while, in the ion beam analyzing apparatus of the third embodiment, the deflecting electrodes 12 are interposed between the objective collimator 7 and the quadruple pole magnetic lenses 8 similarly as in the ion beam analyzing apparatus of the first embodiment, the deflecting electrodes 12 may otherwise be interposed between the quadruple pole magnetic lenses 8 and the vacuum chamber 9 in a similar manner as in the conventional ion beam analyzing apparatus described hereinabove with reference to FIG. 7.

Having now fully described the invention, it will be apparent to one of ordinary skill in the art that many changes and modifications can be made thereto without departing from the spirit and scope of the invention as set forth herein.

What is claimed is:

1. An ion beam analyzing apparatus for irradiating an ion beam upon a specimen to analyze a small area of the specimen, comprising:
   an ion accelerator for accelerating ions generated from an ion source to form an ion beam;
   a vacuum chamber for accommodating therein a specimen to be analyzed, said vacuum chamber including a secondary electron detector;

an objective collimator interposed between said ion accelerator and said vacuum chamber for varying a size of a slit of a slit device to restrict the ion beam;

a magnetic lens interposed between said ion accelerator and said vacuum chamber for converging and irradiating the ion beam upon the specimen in said vacuum chamber to form a beam spot on the specimen;

a deflecting electrode device disposed between said ion accelerator and said vacuum chamber for scanning the beam spot on the specimen when a high frequency potential is applied thereto or a high frequency current is supplied thereto;

display means for displaying thereon a position of the beam spot on the specimen and a detection signal detected by said secondary electron detector in synchronism with the deflecting electrode device as a secondary electron image; and calculating means for calculating dimensions of the beam spot in accordance with size data of said slit of said slit device and displaying on the display means an image in accordance with the thus calculated dimensions of the beam spot.

2. An ion beam analyzing apparatus according to claim 1, wherein said display means further displays thereon the size data of said slit of said slit device.

3. An ion beam analyzing apparatus according to claim 1, wherein said slit device of said objective collimator is capable of varying said slit thereof in the directions X and Y of two perpendicular axes.

4. An ion beam analyzing apparatus according to claim 3, wherein the dimensions X and Y of the beam spot in the X and Y directions are calculated by said calculating means in accordance with the following equations:

$$X = A \times fx$$

$$Y = B \times fy$$

where A is the dimension of said slit of said slit device in the X direction, B is the dimension of said slit of said slit device in the Y direction, fx is a reduction ratio in the X direction of the ion beam by said magnetic lens, and fy is a reduction ratio in the Y direction of the ion beam by said magnetic lens.

5. An ion beam analyzing apparatus according to claim 4, wherein the dimensions X and Y with which the beam spot is to be displayed on said display means in the X and Y directions are calculated in accordance with the following equations:

$$X = A \times fx \times Cx/Sx$$

$$Y = B \times fy \times Cy/Sy$$

where A is the dimension of said slit of said slit device in the X direction, B is the dimension of said slit of said slit device in the Y direction, fx is a reduction ratio in the X direction of the ion beam by said magnetic lens, fy is a reduction ratio in the Y direction of the ion beam by said magnetic lens, Cx is the dimension of the screen of said display means in the X direction, Cy is the dimension of the screen of said display means in the Y direction, Sx is the scanning width in the X direction by said deflecting electrode device, and Sy is the scanning width in the Y direction by said deflecting electrode device.

6. An ion beam analyzing apparatus according to claim 5, wherein said deflecting electrode device is disposed adjacent said ion accelerator with respect to said magnetic lens.

7. An ion beam analyzing apparatus according to claim 5, wherein said deflecting electrode device is disposed adjacent said vacuum chamber with respect to said magnetic lens.

* * * * *